(12) United States Patent
Sanemitsu

(10) Patent No.: US 6,945,466 B2
(45) Date of Patent: Sep. 20, 2005

(54) PC ADAPTER CARDS AND METHOD OF MANUFACTURING THE SAME

(75) Inventor: Yoshikado Sanemitsu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/902,588

(22) Filed: Jul. 12, 2001

(65) Prior Publication Data

US 2002/0038821 A1 Apr. 4, 2002

(30) Foreign Application Priority Data

Sep. 19, 2000 (JP) .................................... P2000-283655

(51) Int. Cl.⁷ .............................................. G06K 19/06
(52) U.S. Cl. ....................... 235/492; 235/375; 235/441; 235/445; 235/451
(58) Field of Search ................................. 235/375, 441, 235/492, 445, 451, 487, 380; 438/110, 111, 121–126, 106, 107, 460, 113; 257/679, 667

(56) References Cited

U.S. PATENT DOCUMENTS

| | | | | |
|---|---|---|---|---|
| 5,362,955 A | * | 11/1994 | Haghiri-Tehrani | 235/492 |
| 5,394,609 A | * | 3/1995 | Ferguson et al. | 29/840 |
| 5,603,629 A | * | 2/1997 | DeFrasne et al. | 439/331 |
| 5,817,207 A | * | 10/1998 | Leighton | 156/298 |
| 5,852,289 A | * | 12/1998 | Masahiko | 235/492 |
| 5,877,542 A | * | 3/1999 | Ohuchi | 257/667 |
| 5,943,769 A | * | 8/1999 | Hohmann et al. | 235/492 |
| 5,946,556 A | * | 8/1999 | Hashizume | 438/124 |
| 5,956,601 A | * | 9/1999 | Sato et al. | 438/458 |
| 6,087,202 A | * | 7/2000 | Exposito et al. | 438/110 |
| 6,089,461 A | * | 7/2000 | Murohara | 235/492 |
| 6,091,137 A | * | 7/2000 | Fukuda | 257/579 |
| 6,117,710 A | * | 9/2000 | Mostafazadeh et al. | 438/106 |
| 6,130,115 A | * | 10/2000 | Okumura et al. | 257/676 |
| 6,137,710 A | * | 10/2000 | Iwasaki et al. | 235/380 |
| 6,193,557 B1 | * | 2/2001 | Luvini et al. | 439/326 |
| 6,214,645 B1 | * | 4/2001 | Kim | 438/110 |
| 6,248,199 B1 | * | 6/2001 | Smulson | 156/244.12 |
| 6,261,865 B1 | * | 7/2001 | Akram | 438/106 |
| 6,291,262 B1 | * | 9/2001 | Udagawa et al. | 438/106 |
| 6,308,894 B1 | * | 10/2001 | Hirai et al. | 235/492 |
| 6,323,064 B1 | * | 11/2001 | Lee et al. | 438/117 |
| 6,372,539 B1 | * | 4/2002 | Bayan et al. | 438/106 |
| 6,383,835 B1 | * | 5/2002 | Hata et al. | 257/433 |
| 6,399,415 B1 | * | 6/2002 | Bayan et al. | 257/692 |
| 6,514,367 B1 | * | 2/2003 | Leighton | 156/153 |
| 6,602,734 B1 | * | 8/2003 | Wada et al. | 438/110 |

FOREIGN PATENT DOCUMENTS

| | | | | |
|---|---|---|---|---|
| DE | 198 33 103 | * | 8/1999 | |
| JP | 02-026269 | | 2/1990 | |
| JP | 3-76691 | * | 4/1991 | |
| JP | 08-064718 | | 3/1996 | |
| JP | 10-135258 | | 5/1998 | |
| JP | 2001156217 | * | 6/2001 | ........... H01L/23/28 |
| KR | 2000-0019186 | | 4/2000 | |

* cited by examiner

*Primary Examiner*—Ahshik Kim
(74) *Attorney, Agent, or Firm*—McDermott Will & Emery LLP

(57) ABSTRACT

A method of manufacturing a mini-card with a semiconductor memory device includes the steps of (a) providing an array of substrates including a plurality of individual substrates; (b) mounting a semiconductor memory device on each of the individual substrates forming the substrate array; (c) covering the individual substrates with respective cases; and (d) dividing the substrate array to provide encased individual substrates each completing a mini-card having the semiconductor memory device embedded therein.

4 Claims, 8 Drawing Sheets

PC ADAPTER CARDS AND METHOD OF MANUFACTURING THE SAME

BACKGROUND OF THE INVENTION

1. Field of the Invention

The present invention relates to a mini-card including a PC card and an IC card with a semiconductor device.

2. Description of the Prior Art

Now, a PCMCIA card (hereinafter referred to as PC card) and an integrated circuit card (hereinafter referred to as IC card) with a non-volatile semiconductor memory device have come to be spreading. Particularly, the PC card is reduced in size to a postage-stamp size. The PC card includes a semiconductor memory device such as an electrically erasable programmable ROM (hereinafter referred to as EEPROM) and one or more capacitors encased within a thin plastic case.

Referring to FIGS. 8A to 8D, the conventional method of manufacturing the IC cards is explained as follows. The method includes:

(1) A step of providing an array of multiple substrates:

An array 301 of multiple substrates including a plurality of substrates connected in line with each other is provided as shown in FIG. 8A.

(2) A step of mounting one or more circuit elements on the substrate array:

Circuit elements such as semiconductor memory devices 302 and 303 and a capacitor 304 are mounted on the individual substrates forming the substrate array as shown in FIG. 8B.

(3) A step of dividing the substrate array to provide the separate substrates:

The substrate array is divided to provide the separate substrates each having the semiconductor memory devices 302 and 303 and the capacitor 304 mounted thereon as shown in FIG. 8C.

(4) A step of encasing the individual substrates:

Referring to FIG. 8D, each substrate is encased in a plastic case by sandwiched it between top and bottom case halves 305 and 306, to thereby complete mini-cards 300 as shown in FIG. 9 in a perspective view.

Generally, before the encasing step, the substrate array is divided to separate the individual substrates 310. Each substrate 310 of a size about equal to that of a postage-stamp is difficult to handle during the encasing step, resulting in decrease of the rate of manufacture of the mini-cards 300.

SUMMARY OF THE INVENTION

Therefore, it is an object of the present invention to improve the rate of manufacture of mini-cards each having a semiconductor memory device.

In accordance with one aspect of the present invention, there is provided a method of manufacturing a mini-card with a semiconductor memory device.

The method includes the steps of:
(a) providing an array of substrates including a plurality of individual substrates;
(b) mounting a semiconductor memory device on each of the individual substrates forming the substrate array;
(c) covering the individual substrates with respective cases;
(d) dividing the substrate array to provide encased individual substrates each completing a mini-card having the semiconductor memory device embedded therein. It is noted that the cases may include plastic cases, ceramic cases, or any other cases, preferably, plastic cases.

In another aspect of the present invention, during the covering step, each substrate may be sandwiched between top and bottom case segments.

In a further aspect of the present invention, during the covering step, each substrate may be molded into case.

The present invention also provides a mini-card with a semiconductor memory device including a substrate and a semiconductor memory device arranged on the substrate covered with a case. Additionally, the substrate is partially exposed outwardly of the case.

According to the method of this invention, the substrate array, that is, the array of multiple substrates connected in line together is used, and encasing the individual substrates is carried out without the multiple substrate being separated from the substrate array. Consequently, if the individual substrate has a postage stamp size, the substrate array can easily be handled during the covering step. Therefore, the rate of manufacture of the mini-cards can be increased.

According to the method of this invention, the individual substrates while being connected in line with each other is sandwiched between top and bottom case segments. Consequently, the substrate array can be dealt with easily, resulting in increase of the rate of manufacture of the mini-cards.

According to the method of this invention, the individual substrates while connected in line with each other may be molded into cases. Consequently, the substrate array can be dealt with easily, resulting in increase of the rate of manufacture of the mini-cards.

According to this invention, the mini-card is manufactured by the above manufacturing method. Therefore, the rate of manufacture of the mini-cards can be increased.

With the mini-card of this invention, the substrate is partially exposed to the outside of the case, because the mini-cards may be manufactured by using the array of the substrates which are subsequently covered with the respective cases. Therefore, the rate of manufacture of the mini-cards can be increased.

DETAILED DESCRIPTION OF THE PREFERRED EMBODIMENTS

Figure 1A:
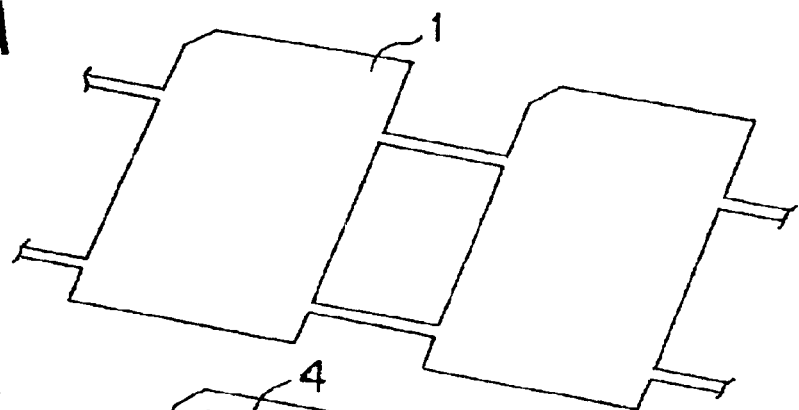
FIGS. 1A to 1D are perspective views showing the sequence of manufacture of the mini-cards according to a first embodiment of the present invention.

Referring to FIGS. 1A to 1D, there is shown a method of manufacturing mini-cards 10 each with semiconductor memory devices 2 and 3 therein. According to the method, during the step of covering with the plastic cases 5 and 6, an array 1 of substrates connected in line together is used without the individual substrates separated from each other. The method includes a step of mounting the semiconductor memory devices 2 and 3 and a capacitor on each of the substrates then connected in line together, a step of covering the substrates of the array 1 between plastic case segments 5 and 6 such that mini-cards can be made, and a step of dividing the array 1 of the encased substrates to provide the mini-cards 10. The method of manufacturing the mini-card 10 is explained as follows.

(1) A step of providing the substrate array:

A substrate array 1 having a plurality of individual substrates connected together is provided as shown in FIG. 1A. The substrate array 1 may be continued along any directions, for example, longitudinal direction or horizontal direction of the individual substrates.

Figure 1B:
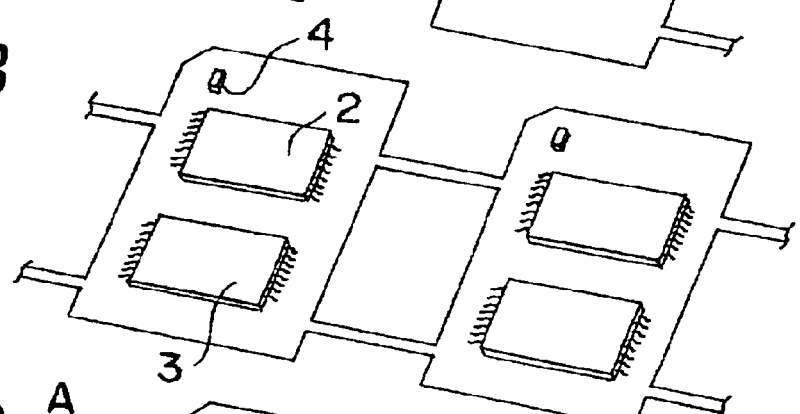

(2) A step of mounting circuit elements such as a semiconductor memory device:

Circuit elements such as semiconductor memory devices 2 and 3 and a capacitor 4 are mounted on each of the substrates that are continuing along a horizontal direction of the individual substrates as shown in FIG. 1B. Arrangement of the elements may be performed by soldering. In addition, at least one semiconductor memory device may be arranged. Preferably, a semiconductor memory device includes a nonvolatile semiconductor memory device such as EEPROM. The circuit elements may not include only a capacitor, but also other element, for example, a resister that will be needed for other application.

Figure 1C:
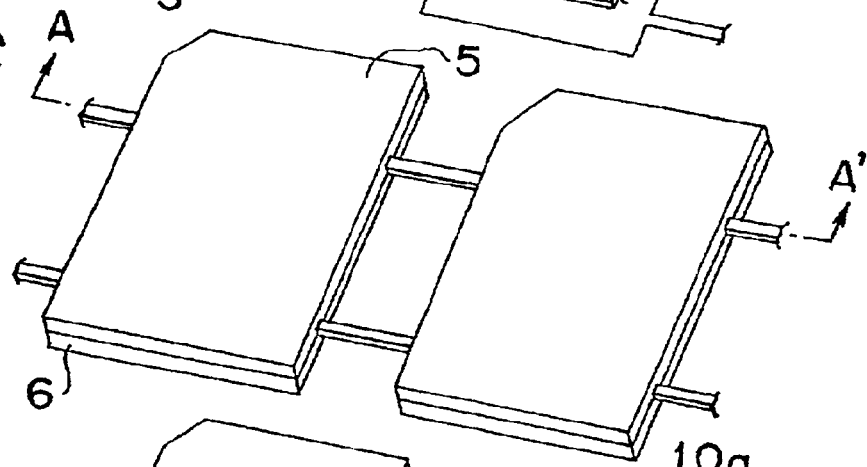
Figure 2:
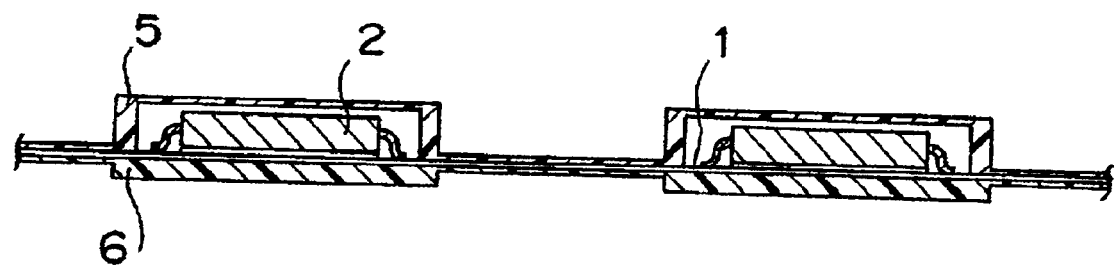
FIG. 2 is a sectional view taken along the A–A' line in FIG. 1C.

(3) A step of covering with plastic case:

Each of the individual substrates forming the substrate array 1 is covered between the plastic case segments 5 and 6 as shown in FIG. 1C. Referring to FIG. 1C, the plastic case segments may be top and bottom plastic case segments 5 and 6, respectively so that the substrate can be sandwiched between the top and bottom plastic case segments. Then, a mini-card including a semiconductor memory device arranged on the substrate covered with the plastic case is made. The top and bottom plastic case segments may be fixed by way of ultrasonic bonding, gluing, or in any other ways. FIG. 2 shows a sectional view taken along the A–A' line in FIG. 1C. Referring to FIG. 2, each substrate can be covered with the plastic case. At least one-side plastic case, for example, top or bottom plastic case segment 5 or 6 may be used. After the covering step, the plastic case exposes partially the substrate.

Figure 1D:
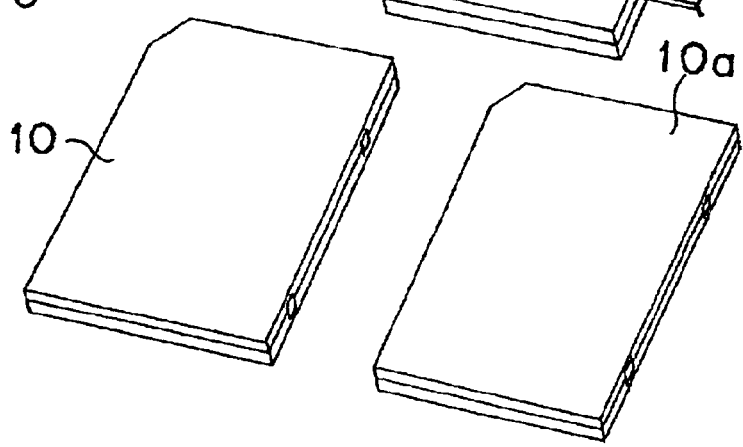

(4) A step of dividing the substrate array:

Each mini-card 10 and 10a including the semiconductor memory devices 2 and 3 arranged on the associated substrate covered with the plastic case segments 5 and 6 is separated as shown in FIG. 1D. The dividing may be performed by cutting with a cutter.

According to the method of manufacturing the mini-cards, the substrate array is used without the individual substrates being dividing. In addition, each of the individual substrates forming the substrate array is covered with plastic case. On the conventional method of manufacturing the IC card, the substrate array is divided into the separate substrates after the step of arranging the element, so that the individual substrates have to be handled independently during the subsequent covering step and other processes. On the other hand, according to the method of the first embodiment, the substrate array is used without the individual substrates separated from each other during the covering step. Therefore, during the covering step, the multiple substrates can be handled easily in the form of the substrate array and, accordingly, the manufacturing rate can be made higher.

Figure 3:
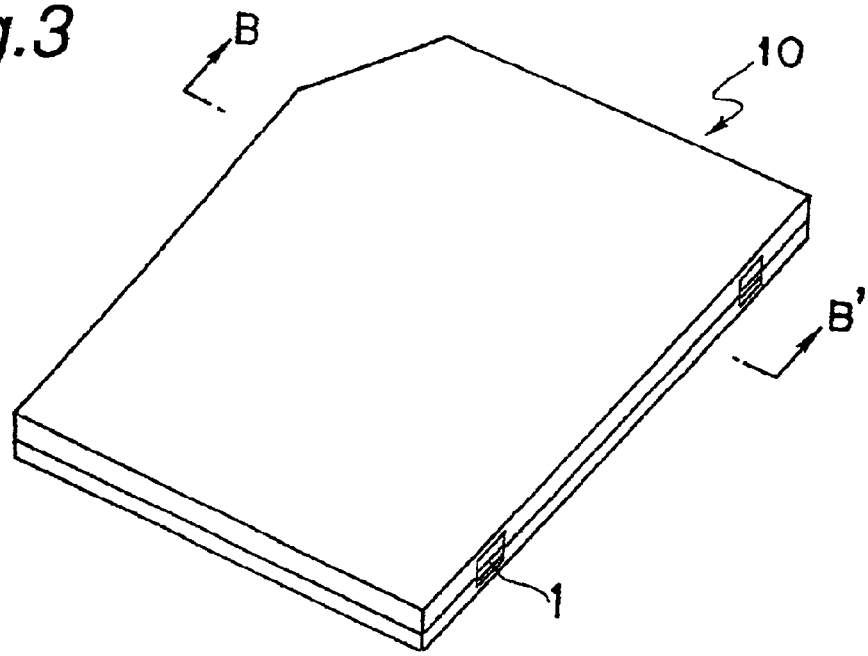
FIG. 3 is a perspective view of the mini-card of the first embodiment of the present invention.
Figure 4:
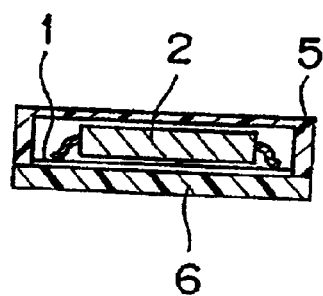
FIG. 4 is a sectional view taken along the B–B' line in FIG. 3.

FIG. 3 shows a perspective view of the mini-card 10 which is manufactured by the method of the first embodiment. Since the mini-cards 10 are fabricated by cutting the substrate array to separate the individual encased substrates, each mini-card 10 exposes partially the substrate 1 at the divided portion.

It is noted that the term "mini-card" means a card having a size that is similar to the PC card (PCMCIA standard card). The mini-card may include a card having a postage-stamp size.

FIG. 5 shows a method of manufacturing the mini-cards 20 according to a second embodiment of the present invention. The method differs from the method of the first embodiment in that, during the covering step, each substrate is molded from plastic without being sandwiched between top and bottom plastic case segments. The method includes the steps of:

(a) providing an array 11 of substrates including a plurality of individual substrates;

(b) mounting a semiconductor device 12, and 13 and a capacitor 14 on each of the individual substrates forming the substrate array;

(c) covering the individual substrates with a plastic case by molding into the plastic case; and (d) dividing the substrate array to provide encased individual substrates each completing a mini-card having the semiconductor memory device embedded therein.

The method of the second embodiment will be explained as follows.

Figure 5A:
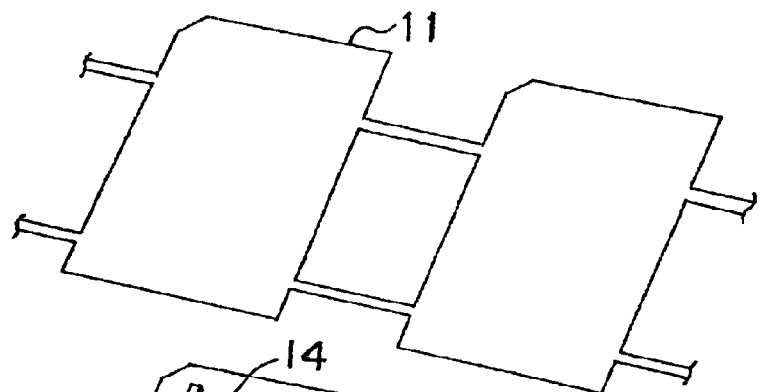
FIGS. 5A to 5D are perspective views showing the method of manufacturing the mini-card according to a second embodiment of the present invention.

(1) A step of providing substrate array:

A substrate array 11 having a plurality of individual substrates connected together is provided as shown in FIG. 5A. It is similar to the first embodiment.

Figure 5B:
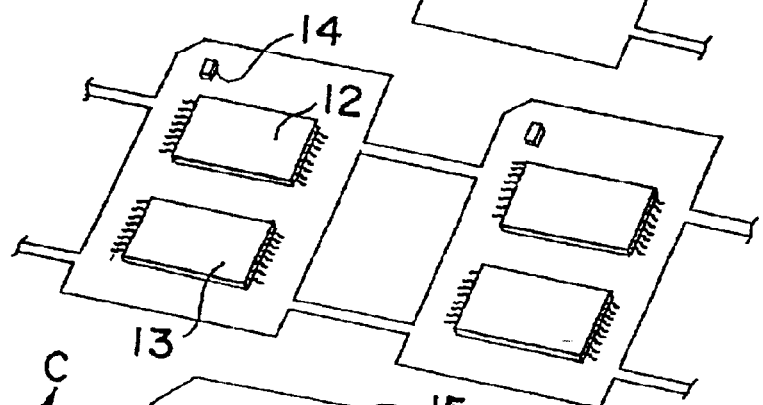

(2) A step of mounting one or more circuit elements on the substrate array:

Circuit elements such as semiconductor memory devices 12, and 13 and a capacitor 14 are mounted on the individual substrates forming the substrate array as shown in FIG. 5B. It is similar to the first embodiment.

Figure 5C:
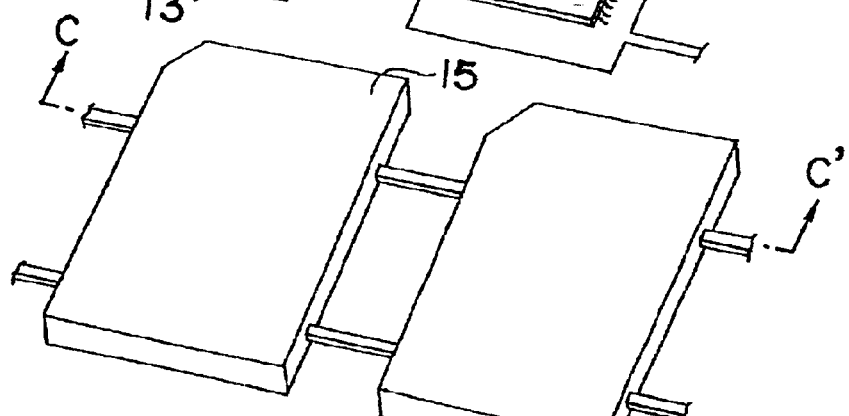
Figure 6:
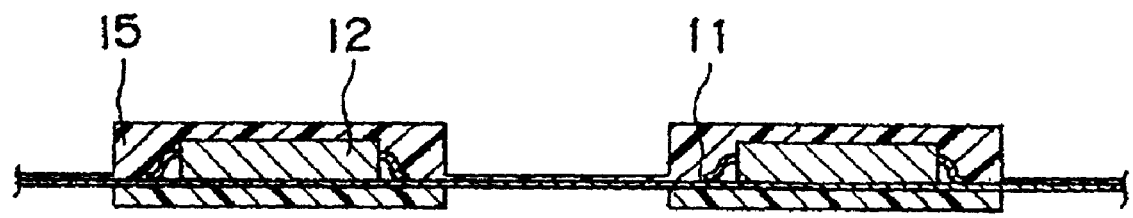
FIG. 6 is a sectional view taken along the C–C' line in FIG. 5C.

(3) A step of covering with plastic case:

Each of the individual substrates forming the substrate array 11 is covered with a plastic case 15 as shown in FIG. 5C. Referring to FIG. 5C, each of substrates is molded into the plastic case 15. Then, a mini-card including a semiconductor memory device mounted on the substrate covered with the plastic case is made. The plastic case 15 may be formed by molding the substrate array into a mold. FIG. 6 shows a sectional view taken along the C–C' line in FIG. 5C. Referring to FIG. 6, each substrate can be covered with plastic case. At least one-side of substrate array 11 may be covered with plastic case 15. After the covering step with the plastic case 15, the plastic case 15 exposes partially the substrate.

Figure 5D:
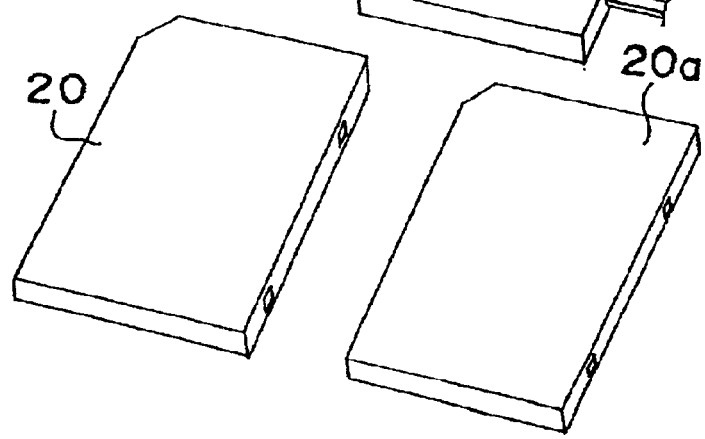

(4) A step of dividing the mini-card:

Each mini-card 20, and 20a including the semiconductor memory devices 12, and 13 mounted on the associated substrate covered with plastic case 15 is separated as shown in FIG. 5D. The dividing may be performed by cutting with a cutter.

According to the method of manufacturing the mini-card of second embodiment, the substrate array is used without the individual substrates being dividing. In addition, each of the individual substrates forming the substrate array is covered with plastic case by molding into the plastic case.

Therefore, during the covering step, the multiple substrates can be handled easily in the form of the substrate array and, accordingly, the manufacturing rate can be made higher.

Figure 7:
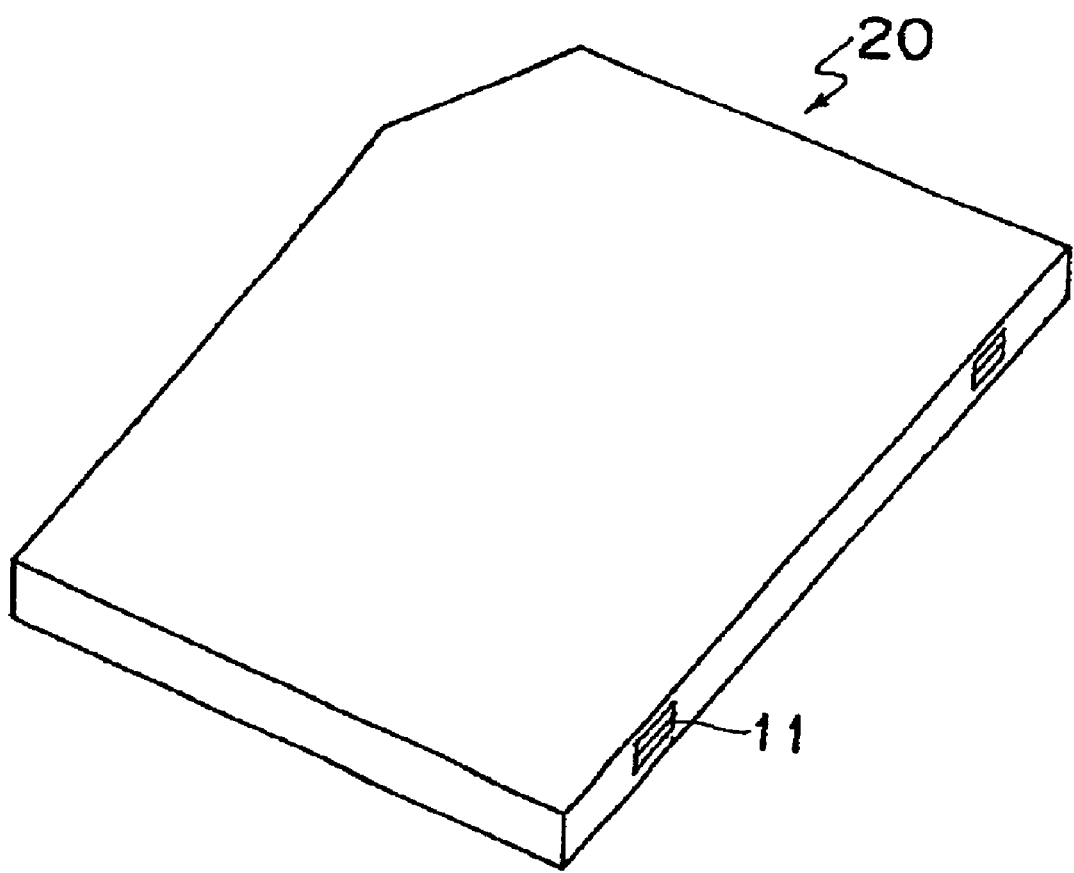
FIG. 7 is a perspective view of the mini-card of the second embodiment of the present invention.
Figure 8A:
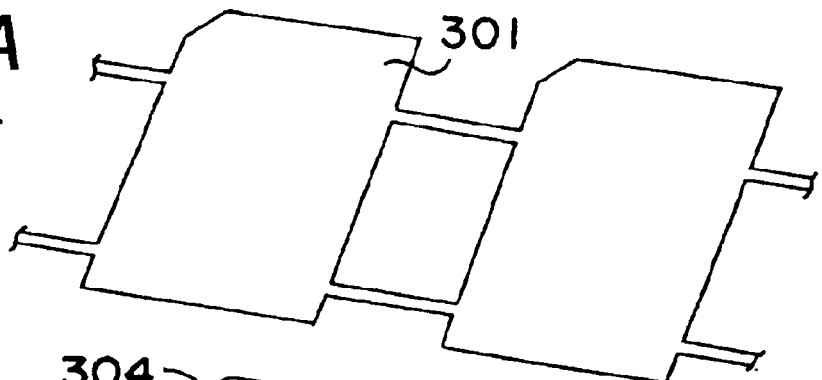
FIGS. 8A to 8D are perspective views showing the sequence of manufacture of the IC card according to the conventional method.
Figure 8B:
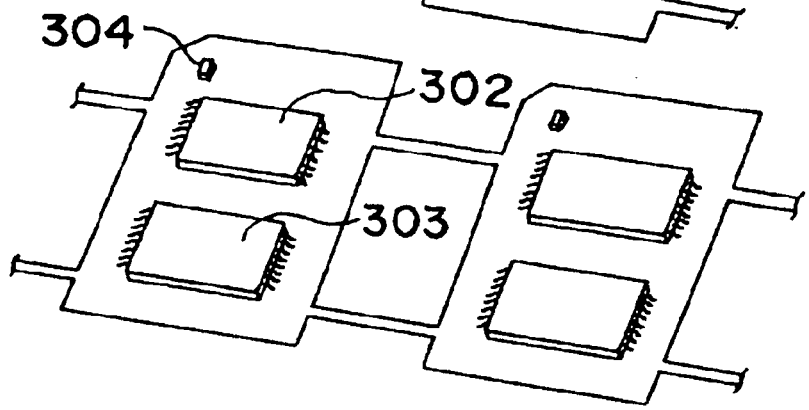
Figure 8C:
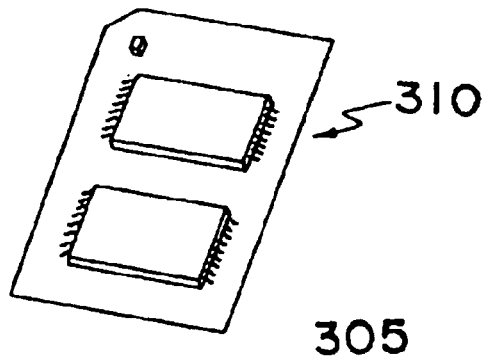
Figure 8D:
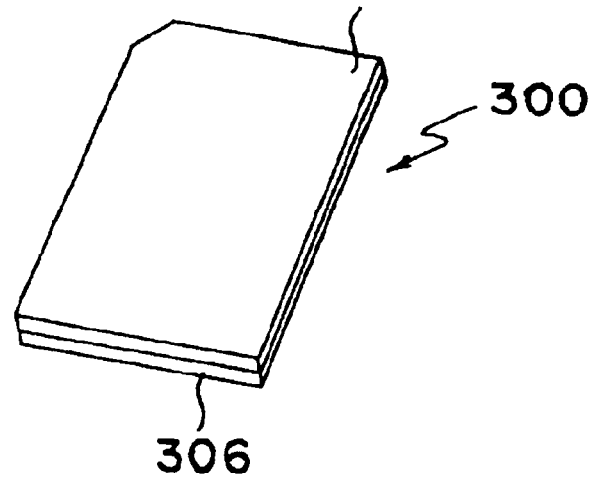
Figure 9:
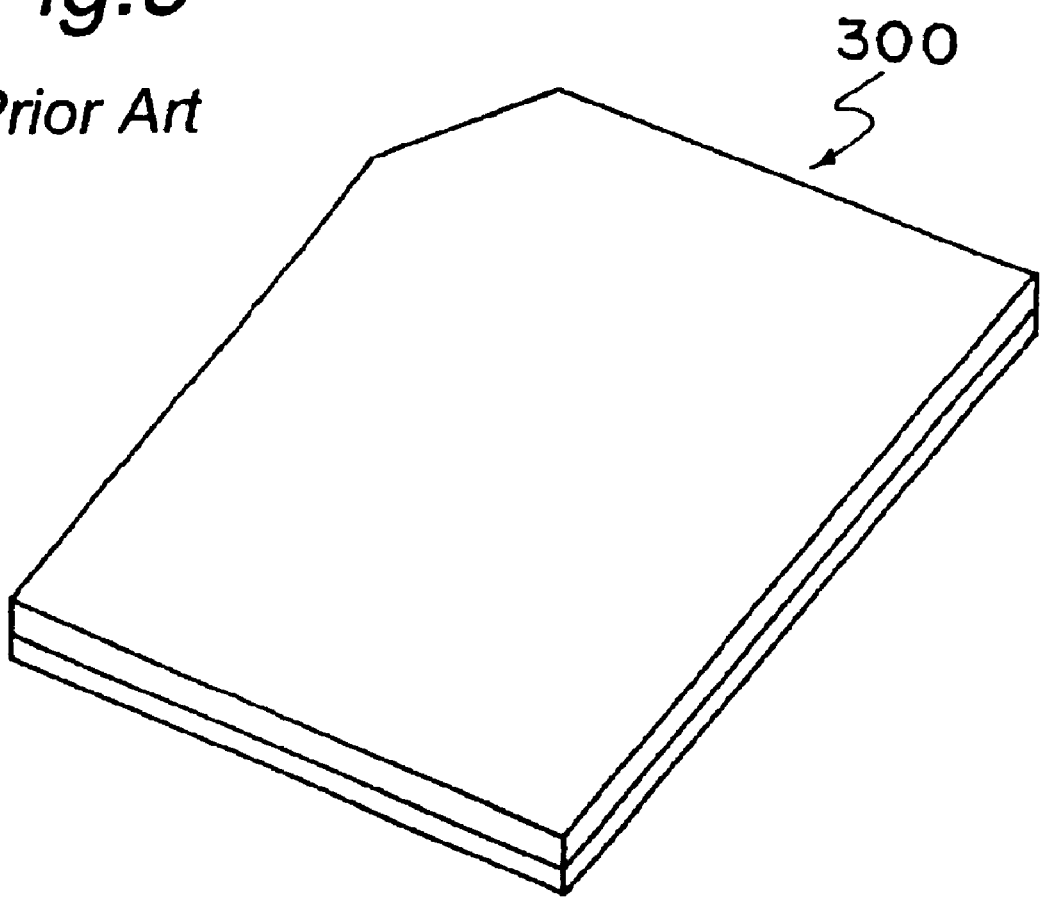
FIG. 9 is a perspective view of the conventional IC-card.

FIG. 7 shows a perspective view of the mini-card 20 which is manufactured by the method of the second embodiment. Since the mini-cards 20 are fabricated by cutting the substrate array to separate the individual encased substrates, each mini-card 20 exposes partially the substrate 11 at the divided portion.

What is claimed is:

1. A method of manufacturing a mini-card with a semiconductor memory device comprising the steps of:

providing an array of substrates including a plurality of individual substrates separated from each other, and being interconnected only by one or more segments;

mounting a semiconductor memory device on each of the individual substrates;

covering the individual substrates with respective cases; and dividing, after the step of covering is completed, the substrate array to provide encased individual substrates each completing the mini-card having the semiconductor memory device embedded therein.

2. The method of manufacturing a mini-card with a semiconductor memory device according to claim 1, wherein, during the covering step, each substrate is sandwiched between top and bottom case segments.

3. The method of manufacturing a mini-card with a semiconductor memory device according to claim 1, wherein, during the covering step, each substrate is molded into case.

4. A mini-card with a semiconductor memory device characterized in that the mini-card is manufactured by a method comprising the steps of:

providing an array of substrates including a plurality of individual substrates separated from each other, and being interconnected only by one or more segments;

mounting a semiconductor memory device on each of the individual substrates;

covering the individual substrates with respective cases; and dividing, after the step of covering is completed, the substrate array to provide encased individual substrates each completing the mini-card having the semiconductor memory device embedded therein.

* * * * *